United States Patent
Waayers

(10) Patent No.: US 10,162,000 B2
(45) Date of Patent: Dec. 25, 2018

(54) TESTING AN INTEGRATED CIRCUIT DEVICE WITH MULTIPLE TESTING PROTOCOLS

(75) Inventor: Tom Waayers, Eindhoven (NL)

(73) Assignee: NXP B.V., Eindhoven (NL)

(*) Notice: Subject to any disclaimer, the term of this patent is extended or adjusted under 35 U.S.C. 154(b) by 1829 days.

(21) Appl. No.: 13/397,985

(22) Filed: Feb. 16, 2012

(65) Prior Publication Data

US 2013/0218507 A1     Aug. 22, 2013

(51) Int. Cl.
    *G01R 31/317*     (2006.01)
    *G01R 31/3185*     (2006.01)

(52) U.S. Cl.
    CPC ............. *G01R 31/3172* (2013.01); *G01R 31/318572* (2013.01)

(58) Field of Classification Search
    CPC .... G01R 31/318555; G01R 31/318572; G01R 31/3172
See application file for complete search history.

(56) References Cited

U.S. PATENT DOCUMENTS

| | | | |
|---|---|---|---|
| 5,412,260 A * | 5/1995 | Tsui et al. | 326/39 |
| 5,757,680 A * | 5/1998 | Boston et al. | 702/121 |
| 7,191,265 B1 * | 3/2007 | De Angeli et al. | 710/104 |
| 7,550,995 B1 * | 6/2009 | Guilloteau et al. | 326/38 |
| 2010/0211336 A1 * | 8/2010 | Madrid | H01L 25/065 702/57 |

OTHER PUBLICATIONS

Artur Jutman, "Board-level testing and IEEE1149.x Boundary Scan standard", Feb. 2011, Tallinn University of Technology.*
IEEE-SA Standards Board, "IEEE Standard Test Access Port and Boundary-Scan Architecture". IEEE Std 1149.1-2001 (R2008).*
Michael Williams, "Low Pin-count Debug Interfaces for Multi-device Systems", 2009.*
National Semiconductor, "SCANSTA112 7-Port Multidrop IEEE 1149.1 (JTAG) Multiplexer" Oct. 2005 pp. 1-15.*

* cited by examiner

*Primary Examiner* — Regis Betsch

(57) ABSTRACT

Various exemplary embodiments relate to an integrated circuit device that includes a plurality of input/output pins, device circuitry, a first testing protocol interface connected to the device circuitry and to the plurality of input/output pins, and a second testing protocol interface connected to the device circuitry and to the same plurality of input/output pins as the first testing protocol interface. The first testing protocol interface is configured to test the device circuitry with a first testing protocol, and the second testing protocol interface is configured to test the device circuitry with a second testing protocol.

13 Claims, 7 Drawing Sheets

| STATE | TMS | TDI | NEXT STATE |
|---|---|---|---|
| IDLE | 0 | 0 | IDLE |
| IDLE | 0 | 1 | IDLE |
| IDLE | 1 | 0 | CONTINUE PROTOCOL |
| IDLE | 1 | 1 | CONTINUE PROTOCOL |

| STATE | TMS/SI | TDI/SE | NEXT STATE |
|-------|--------|--------|------------|
| IDLE  | 0      | 0      | IDLE       |
| IDLE  | 0      | 1      | IDLE       |
| IDLE  | 1      | 0      | CONTINUE PROTOCOL 1 |
| IDLE  | 1      | 1      | ENABLE PROTOCOL 2 |

FIG. 6

| STATE | TMS/SI | TDI/SE | NEXT STATE |
|---|---|---|---|
| IDLE | 0 | 0 | IDLE |
| IDLE | 0 | 1 | ENABLE PROTOCOL 2 |
| IDLE | 1 | 0 | CONTINUE PROTOCOL 1 |
| IDLE | 1 | 1 | ENABLE PROTOCOL 2 |

FIG. 8

TESTING AN INTEGRATED CIRCUIT DEVICE WITH MULTIPLE TESTING PROTOCOLS

TECHNICAL FIELD

Various exemplary embodiments disclosed herein relate generally to the testing of an integrated circuit device.

BACKGROUND

After being manufactured, integrated circuit devices are often tested to ensure they function properly and/or to detect defects within the devices. The integrated circuit devices may be tested by using a standardized testing protocol, such as the Joint Test Action Group (JTAG) protocol. The integrated circuit devices may also be tested using other protocols, such as the SCAN protocol. Various tests and protocols may be used to test for different functions and defects in the integrated circuit devices.

SUMMARY

A brief summary of various exemplary embodiments is presented. Some simplifications and omissions may be made in the following summary, which is intended to highlight and introduce some aspects of the various exemplary embodiments, but not to limit the scope of the invention. Detailed descriptions of exemplary embodiments adequate to allow those of ordinary skill in the art to make and use the inventive concepts will follow in later sections.

Various exemplary embodiments relate to an integrated circuit device, including: a plurality of input/output pins; device circuitry; a first testing protocol interface connected to the device circuitry and to the plurality of input/output pins; and a second testing protocol interface connected to the device circuitry and to the same plurality of input/output pins as the first testing protocol interface; wherein the first testing protocol interface is configured to test the device circuitry with a first testing protocol, and wherein the second testing protocol interface is configured to test the device circuitry with a second testing protocol.

In some embodiments, the first testing protocol is a JTAG protocol, and the second testing protocol is a SCAN protocol. In some embodiments, the first testing protocol includes an IDLE state, and the second testing protocol is enabled from the IDLE state of the first testing protocol. In some embodiments, the plurality of input/output pins include: a first pin configured as a data input pin for the first testing protocol interface and an enable pin for the second testing protocol interface; a second pin configured as a mode select pin for the first testing protocol interface and a data input pin for the second testing protocol interface; a third pin configured as a clock input pin for the first testing protocol interface and a clock pin for the second testing protocol interface; and a fourth pin configured as a data output pin for the first testing protocol interface and a data output pin for the second testing protocol interface. In some embodiments, a voltage level at the first pin and a voltage level at the second pin determine if the device circuitry is tested with one of the first testing protocol and the second testing protocol. In some embodiments, the device circuitry is tested with the first testing protocol when the voltage level at the first pin is low and when the voltage level at the second pin is high, and wherein the device circuitry is tested with the second testing protocol when the voltage level at the first pin is high and when the voltage level at the second pin is high. In some embodiments, the device circuitry is tested with the second testing protocol when the voltage level at the first pin is high and when the voltage level at the second pin is low.

Various exemplary embodiments further relate to a method for testing an integrated circuit device, including: initiating a first testing protocol on the integrated circuit device; entering an IDLE state of the first testing protocol; and enabling a second testing protocol from the IDLE state of the first testing protocol.

In some embodiments, the first testing protocol is a JTAG protocol, and the second testing protocol is a SCAN protocol. In some embodiments, the method further includes: testing device circuitry of the integrated circuit device with the second testing protocol. In some embodiments, the method further includes: continuing the first testing protocol from the IDLE state of the first testing protocol; and testing device circuitry of the integrated circuit device with the first testing protocol. In some embodiments, the method further includes: entering the IDLE state of the first testing protocol after testing the device circuitry with the second testing protocol; continuing the first testing protocol from the IDLE state of the first testing protocol; and testing device circuitry of the integrated circuit device with the first testing protocol. In some embodiments, the integrated circuit device includes a plurality of input/output pins. In some embodiments, the method further includes: determining a voltage level at a first pin of the integrated circuit device; determining a voltage level at a second pin of the integrated circuit device; and selecting one of the first testing protocol and the second testing protocol based upon the voltage level at the first pin and the voltage level at the second pin. In some embodiments, the method further includes: selecting the first testing protocol when the voltage level at the first pin is low and when the voltage level at the second pin is high; and selecting the second testing protocol when the voltage level at the first pin is high and when the voltage level at the second pin is high. In some embodiments, the method further includes: selecting the second testing protocol when the voltage level at the first pin is high and when the voltage level at the second pin is low.

Various exemplary embodiments further relate to a method for testing an integrated circuit device, including: resetting the integrated circuit device using a first testing protocol; entering an IDLE state of the first testing protocol if a mode select/input pin of the integrated circuit device is low, and resetting the integrated circuit device if the mode select/input pin of the integrated circuit device is high; and enabling a second testing protocol from the IDLE state of the first testing protocol if the mode select/input pin of the integrated circuit device is high and an input/enable pin of the integrated circuit device is high, and continuing the first testing protocol if the mode select/input pin of the integrated circuit device is high and the input/enable pin of the integrated circuit device is low.

In some embodiments, the method further includes enabling a second testing protocol from the IDLE state of the first testing protocol if the mode select/input pin of the integrated circuit device is low and a input/enable pin of the integrated circuit device is high. In some embodiments, the method further includes returning to the IDLE state of the first testing protocol if the mode select/input pin of the integrated circuit device is low. In some embodiments, the method further includes returning to the IDLE state of the first testing protocol if the mode select/input pin of the integrated circuit device is low and the input/enable pin of the integrated circuit device is low.

BRIEF DESCRIPTION OF THE DRAWINGS

In order to better understand various exemplary embodiments, reference is made to the accompanying drawings, wherein:

FIG. 6 is a table that illustrates an embodiment of the operation of an extended protocol when in an IDLE state;

FIG. 8 is a table that illustrates an embodiment of the operation of an extended protocol when in an IDLE state.

DETAILED DESCRIPTION

Figure 1:
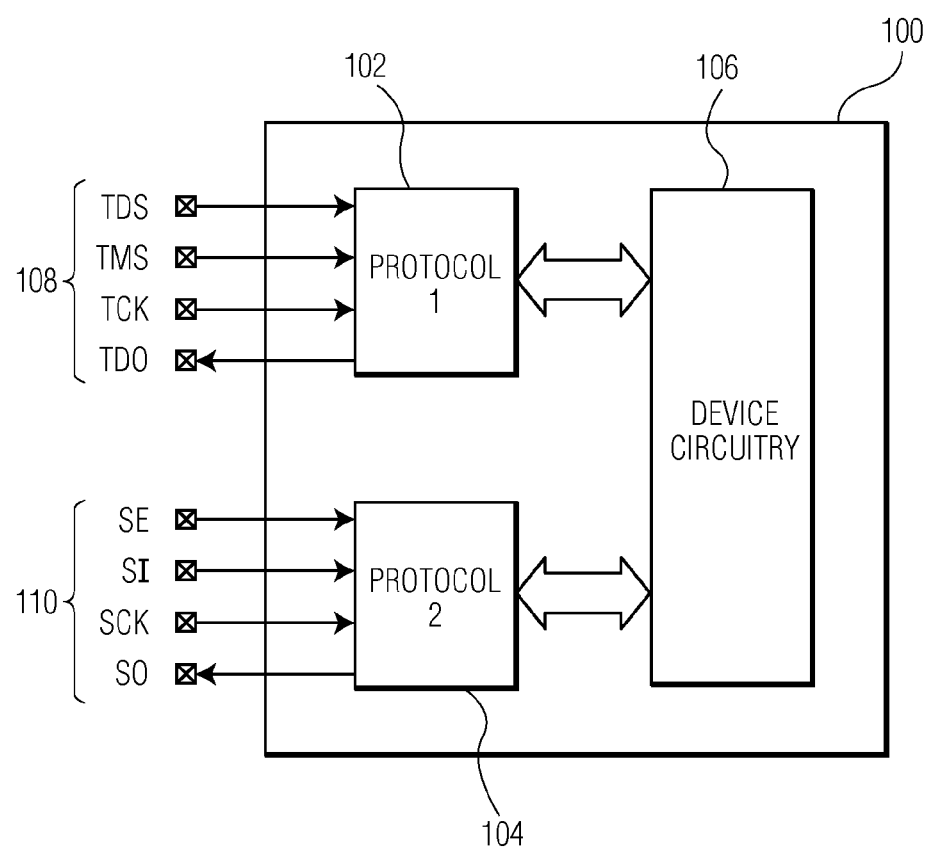
FIG. 1 illustrates an embodiment of a conventional integrated circuit device.

Referring now to the drawings, in which like numerals refer to like components or steps, there are disclosed broad aspects of various exemplary embodiments.

FIG. 1 illustrates an embodiment of a conventional integrated circuit device 100. The integrated circuit device 100 may include a first protocol interface 102 and a second protocol interface 104. The first protocol interface 102 and the second protocol interface 104 may each send and receive signals from device circuitry 106. The device circuitry 106 may include various integrated circuit components, such as, for example, logic gates, data registers, instruction registers, and/or other components. The first protocol interface 102 may include at least four first protocol input/output pins 108. The first protocol input/output pins 108 may include a Test Data Input (TDI) pin, a Test Mode Select (TMS) pin, a Test Clock (TCK) pin, and a Test Data Output (TDO) pin. The second protocol interface 104 may include at least four second protocol input/output pins 110. The second protocol input/output pins 110 may include a Second Protocol Enable (SE) pin, a Second Protocol Input (SI) pin, a Second Protocol Clock (SCK) pin, and a Second Protocol Output (SO) pin.

The circuitry 106 of the integrated circuit device 100 may be tested by using a conventional first testing protocol and a conventional second testing protocol. The first testing protocol may be, for example, a JTAG protocol. The second testing protocol may be, for example, a SCAN protocol. To perform a first protocol test, the TDI, TMS, TCK, and TDO pins may be connected to a first protocol testing device (not shown). The first protocol testing device may send first protocol input signals to the integrated circuit device 100 and may receive first protocol output signals from the integrated circuit device 100 to determine if the device circuitry 106 is functioning properly. To perform a second protocol test, the SE, SI, SCK, and SO pins may be connected to a second protocol testing device (not shown). The second protocol testing device and the first protocol testing device may be the same device. The second protocol testing device may send second protocol input signals to the integrated circuit device 100 and may receive second protocol output signals from the integrated circuit device 100 to further determine if the device circuitry 106 functions properly.

Testing the integrated circuit device 100 with both the first protocol and the second protocol may increase the time it takes to verify the integrated circuit device 100 functions properly and/or may increase the time it takes to detect if the integrated circuit device 100 contains any defects. When one test is concluded, the integrated circuit device 100 may need to be attached to another testing device. Alternatively, if the testing device supports both the first protocol and the second protocol, then there may be a delay time when transitioning between the two testing protocols. Integrated circuit devices are often manufactured in very large quantities, and the process of testing large quantities of integrated circuit devices with the two protocols may be time-consuming. Therefore, there is a need to reduce the time taken to test an integrated circuit device with the two testing protocols.

Further, the input/output pins 108 of the integrated circuit device 100 may be dedicated to testing with the first protocol interface 102, and the input/output pins 110 of the integrated circuit device 100 may be dedicated to testing with the second protocol interface 104. Many integrated circuit devices have fewer than eight pins available for testing. Therefore, there is a need to reduce the number of input/output pins necessary to test an integrated circuit device with two testing protocols.

Figure 2:
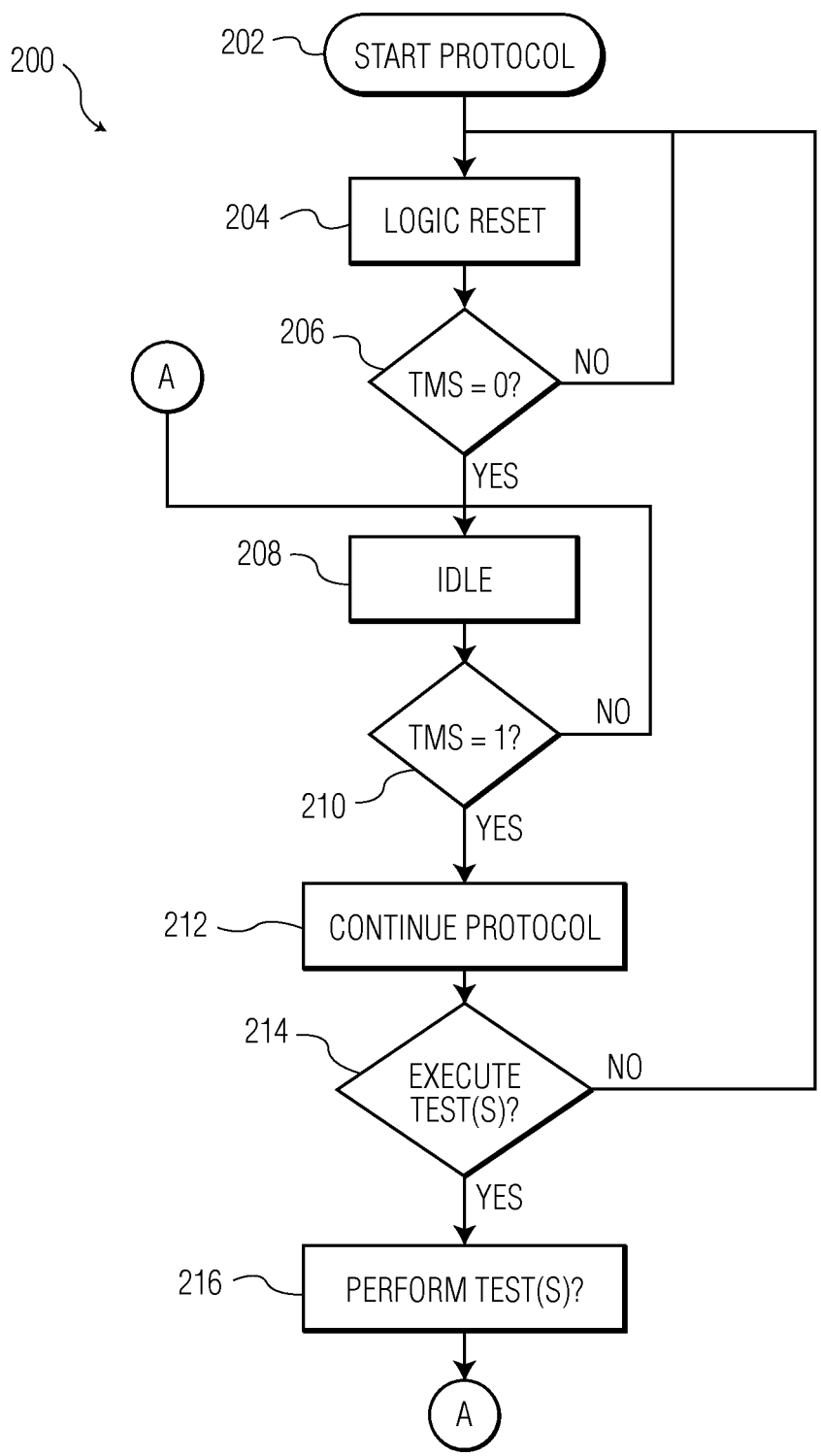
FIG. 2 illustrates an embodiment of a method for a conventional testing protocol.

FIG. 2 illustrates an embodiment of a method for a conventional testing protocol 200 that may be implemented by the integrated circuit device 100. The protocol 200 may be, for example a conventional JTAG protocol. Each of the state changes of the protocol 200 may occur with a clock cycle at the TCK pin. After starting at block 202, the protocol 200 may enter a LOGIC RESET state 204. From the LOGIC RESET state 204, the protocol 200 may determine the value at the TMS pin in step 206. If the TMS pin is high, or "1", then the protocol 200 may return to the LOGIC RESET state 204. If the TMS pin is low, or "0", then the protocol 200 may continue to the IDLE state 208. From the IDLE state 208, the first protocol 200 may again determine the value at the TMS pin in step 210. If the TMS pin is low, or "0", then the protocol 200 may return to the IDLE state 208. If the TMS pin is high, or "1", then the protocol 200 may proceed to the CONTINUE PROTOCOL state 212. From the CONTINUE PROTOCOL state 212, the protocol 200 may determine whether to execute one or more tests, as shown in step 214. If the protocol 200 does not execute any tests, then the protocol 200 may return to the LOGIC RESET state 204. If the protocol 200 does execute one or more tests, then the first protocol 200 may proceed to the PERFORM TEST(S) state 216. The PERFORM TEST(S) state 216 may include additional states necessary to perform one or more of the desired tests. While in the PERFORM TEST(S) state 216, the protocol 200 may test device circuitry 106 such as, for example, data registers and instruction registers. After completing one or more tests, the protocol 200 may return to the IDLE state 208.

Figures 3, 4:
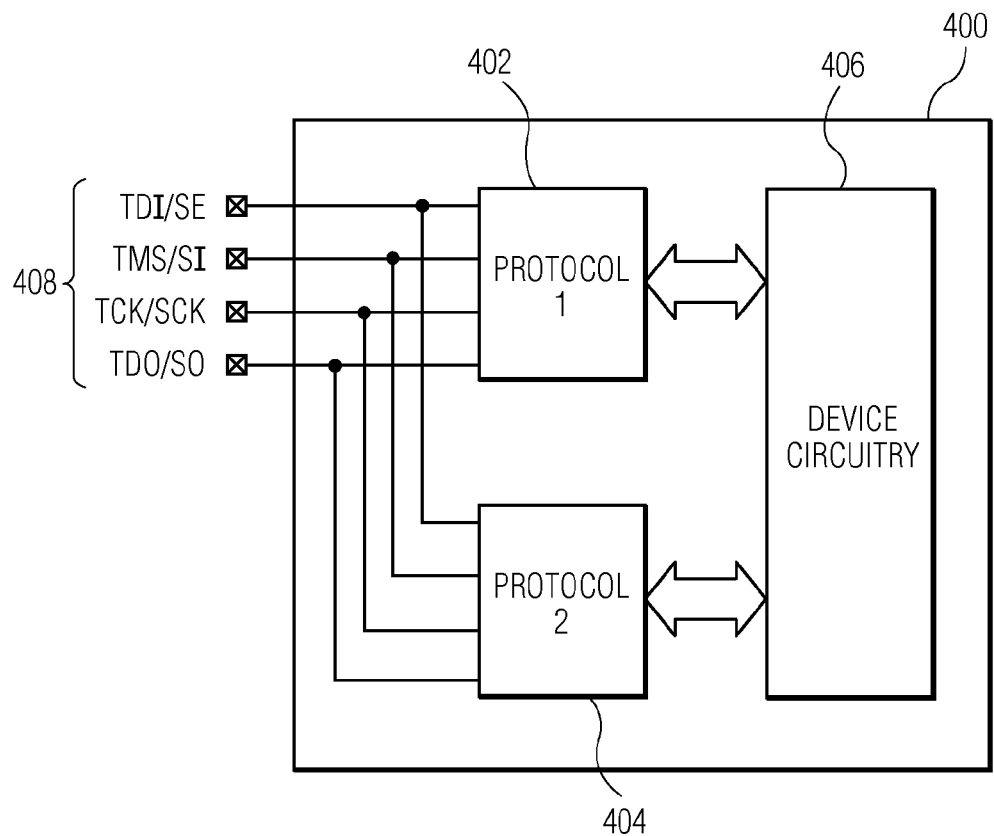
FIG. 3 is a table that illustrates an embodiment of the operation of a testing protocol when in an IDLE state.
FIG. 4 illustrates an embodiment of an integrated circuit device.

FIG. 3 is a table that further illustrates an embodiment of the operation of the protocol 200 when in the IDLE state. Each of the state changes of the protocol 200 may occur with a clock cycle at the TCK pin. The protocol 200 may exit the IDLE state and may proceed to the CONTINUE PROTOCOL state when the TMS pin is high, or "1". Otherwise, the protocol 200 may return to the IDLE state. The value of the TDI pin may not affect whether the protocol 200 proceeds to the CONTINUE PROTOCOL state, or remains in the IDLE state. While in the IDLE state of the protocol 200, the integrated circuit device 100 may undergo other testing events that do not belong to the protocol 200.

FIG. 4 illustrates an embodiment of an integrated circuit device 400. The integrated circuit device 400 may include a first protocol interface 402 and a second protocol interface 404. The first protocol interface 402 and the second protocol interface 404 may each send and receive signals from device circuitry 406. The device circuitry 406 may include various integrated circuit components, such as, for example, logic gates, data registers, instruction registers, and/or other components. The first protocol interface 402 and the second protocol interface 404 may share input/output pins 408. The input/output pins 408 may include a combination Test Data Input and Second Protocol Enable (TDI/SE) pin, a combination Test Mode Select and Second Protocol Input (TMS/SI) pin, a combination Test Clock and Second Protocol Clock (TCK/SCK) pin, and a combination Test Data Output and Second Protocol Output (TDO/SO) pin.

Figure 5:
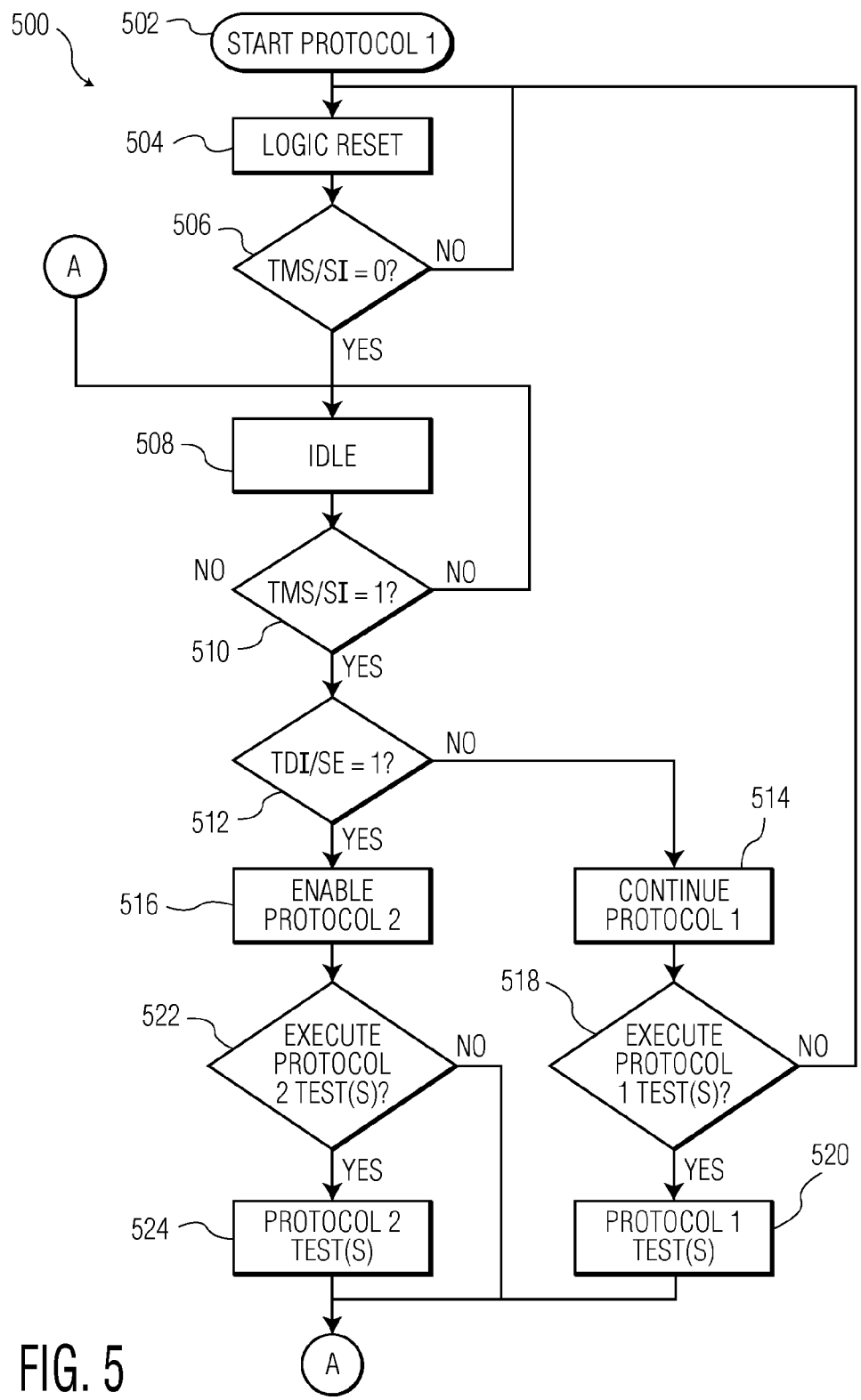
FIG. 5 illustrates an embodiment of a method for an extended protocol.

FIG. 5 illustrates an embodiment of a method for an extended protocol 500 that may be implemented by the integrated circuit device 400. The extended protocol 500 may allow tests using a first protocol and tests using a second protocol to be performed on the device 400. The first protocol may be, for example, a JTAG protocol. The second protocol may be, for example, a SCAN protocol. The extended protocol 500 may allow the second protocol to be executed without ending the first protocol. Each of the state changes of the extended protocol 500 may occur with a clock cycle at the TCK/SCK pin. The extended protocol 500 may begin with the first protocol at block 502. From block 502, the extended protocol 500 may enter a LOGIC RESET state 504. From the LOGIC RESET state 504, the extended protocol 500 may determine the value at the TMS/SI pin in step 506. If the TMS/SI pin is high, or "1", then the extended protocol 500 may return to the LOGIC RESET state 504. If the TMS/SI pin is low, or "0", then the extended protocol 500 may continue to an IDLE state 508. From the IDLE state 508, the extended protocol 500 may determine whether to continue with the first protocol, or whether to enable the second protocol. Other test events (not shown) that do not belong to the extended protocol 500 may also occur while in the IDLE state 508, such as, for example, capture cycles and/or BIST execution cycles. The extended protocol 500 may determine the value at the TMS/SI pin in step 510. If the TMS/SI pin is low, or "0", then the extended protocol 500 may return to the IDLE state 508. If the TMS/SI pin is high, or "1", then the extended protocol 500 may next determine the value at the TDI/SE pin in step 512. If the TDI/SE pin is low, or "0", then the extended protocol 500 may proceed to the CONTINUE PROTOCOL ONE state 514. If the TDI/SE pin is high, or "1", then the extended protocol 500 may proceed to the ENABLE PROTOCOL TWO state 516.

From the CONTINUE PROTOCOL ONE state 514, the extended protocol 500 may determine whether to execute one or more first protocol tests, as shown in step 518. If the extended protocol 500 does not execute any first protocol tests, then the extended protocol 500 may return to the LOGIC RESET state 504. If the extended protocol 500 does execute one or more first protocol tests, then the extended protocol 500 may proceed to the PROTOCOL ONE TEST(S) state 520. The PROTOCOL ONE TEST(S) state 520 may include additional states necessary to perform one or more of the desired first protocol test(s). While in the PROTOCOL ONE TEST(S) state 520, the extended protocol 500 may test device circuitry 406 such as, for example, data registers and instruction registers. Further, while in the PROTOCOL ONE TEST(S) state 520, on-chip conditions for other testing protocols or test events may be controlled, including for example, conditions for the second protocol test, BIST execution cycles, and/or capture cycles. After completing one or more first protocol tests, the extended protocol 500 may return to the IDLE state 508.

From the ENABLE PROTOCOL TWO state 516, the extended protocol 500 may determine whether to execute one or more second protocol tests, as shown in step 522. If the extended protocol 500 does not execute any second protocol tests, then the extended protocol 500 may return to the IDLE state 508. If the extended protocol 500 does execute one or more second protocol tests, then the extended protocol 500 may proceed to the PROTOCOL TWO TEST(S) state 524. The PROTOCOL TWO TEST(S) state 524 may include additional states necessary to perform one or more of the desired second protocol test(s). While in the PROTOCOL TWO TEST(S) state 524, the extended protocol 500 may test device circuitry 406 such as, for example, logic gates. Further, while in the PROTOCOL TWO TEST(S) state 524, on-chip conditions for other testing protocols or test events may be controlled, including for example, conditions for the first protocol test, BIST execution cycles, and/or capture cycles. After completing one or more second protocol tests, the extended protocol 500 may return to the IDLE state 508.

FIG. 6 is a table that further illustrates an embodiment of the operation of the extended protocol 500 when in the IDLE state. Each of the state changes of the extended protocol 500 may occur with a clock cycle at the TCK/SCK pin. From the IDLE state, the next state of the extended protocol 500 may be dependent upon the value of both the TMS/SI pin and the TDI/SE pin. The extended protocol 500 may exit the IDLE state and may proceed to the CONTINUE PROTOCOL ONE state when the TMS/SI pin is high, or "1", and the TDI/SE pin is low, or "0". The extended protocol 500 may exit the IDLE state and may proceed to the ENABLE PROTOCOL TWO state when the TMS/SI pin is high, or "1", and the TDI/SE pin is high, or "1". The extended protocol 500 may return to the IDLE state when the TMS/SI pin is low, or "0", and the TDI/SE pin is low, or "0". The extended protocol 500 may also return to the IDLE state when the TMS/SI pin is low, or "0", and the TDI/SE pin is high, or "1". While in the IDLE state of the extended protocol 500, the integrated circuit device 400 may also undergo other testing events that do not belong to the extended protocol 500, such as, for example, capture cycles and/or BIST execution cycles.

The extended protocol 500 may allow a device to be tested with multiple tests more quickly than with two individual protocols. The extended protocol 500 may enable the second protocol without ending the first protocol. After completing one or more second protocol tests, the extended protocol may return to the IDLE state, and then may proceed with one or more additional first protocol tests. Alternatively or in addition, the extended protocol 500 may perform one or more first protocol tests, then may enable a second protocol test from the IDLE state of the extended protocol 500. Because the extended protocol 500 may allow for multiple types of tests to be performed without exiting the protocol, the tests may be performed more quickly than if the tests each used individual protocols.

The extended protocol 500 may also allow a device with only four input/output pins available for testing to be tested with multiple protocols. By sharing the input/output pins with multiple protocol interfaces, multiple sets of pins for each type of test may not be necessary.

Figure 7:
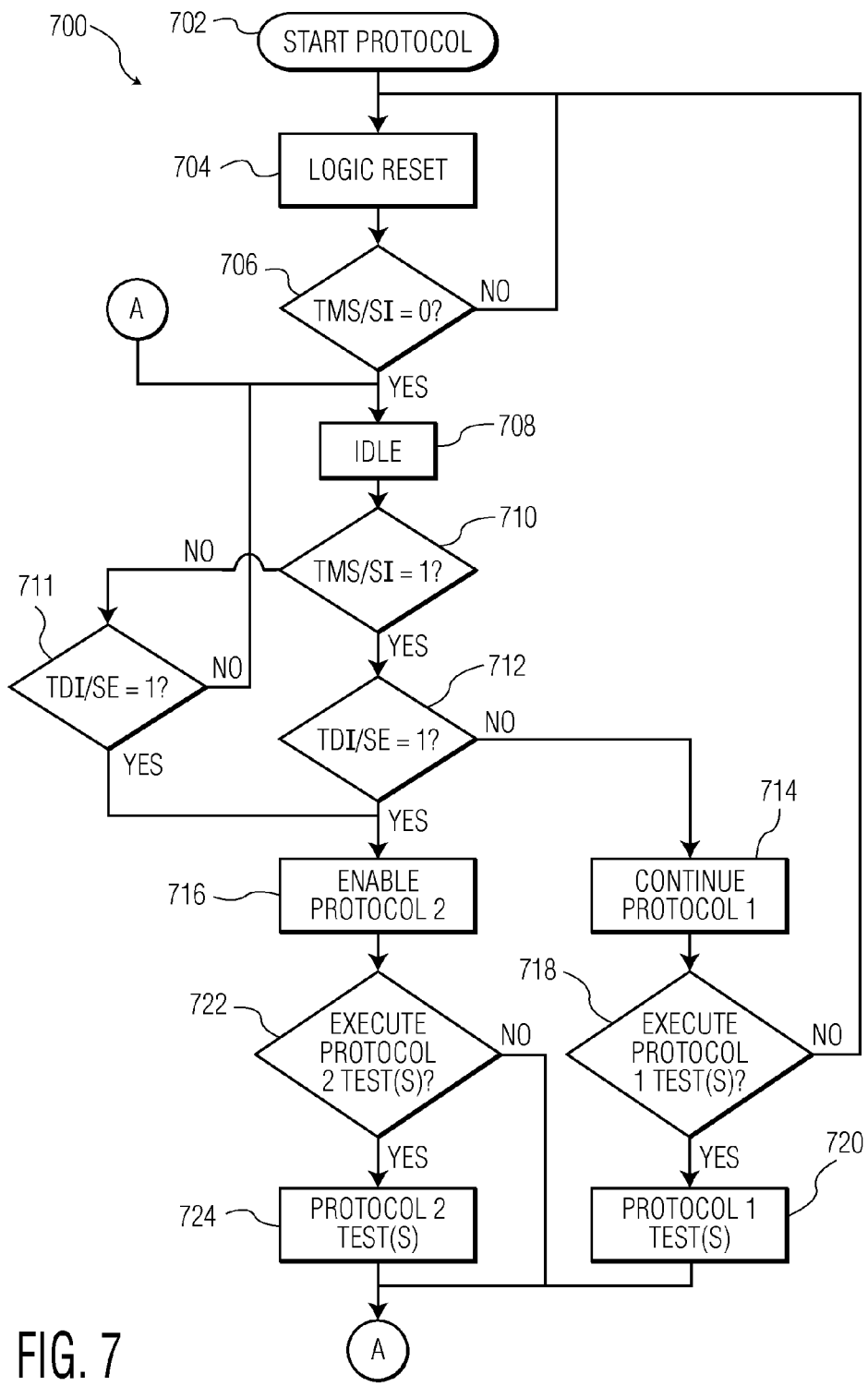
FIG. 7 illustrates an alternative embodiment of a method for an extended protocol.

FIG. 7 illustrates an alternative embodiment of a method for an extended protocol 700 that may be implemented by the integrated circuit device 400. The extended protocol 700 may allow tests using a first protocol and tests using a second protocol to be performed on the device 400. The first protocol may be, for example, a JTAG protocol. The second protocol may be, for example, a SCAN protocol. The extended protocol 700 may allow the second protocol to be executed without ending the first protocol. Each of the state changes of the extended protocol 700 may occur with a clock cycle at the TCK/SCK pin. The extended protocol 700 may begin with the first protocol at block 702. From block 702, the extended protocol 700 may enter a LOGIC RESET state 704. From the LOGIC RESET state 704, the extended protocol 700 may determine the value at the TMS/SI pin in step 706. If the TMS/SI pin is high, or "1", then the extended protocol 700 may return to the LOGIC RESET state 704. If the TMS/SI pin is low, or "0", then the extended protocol 700 may continue to an IDLE state 708. From the IDLE state 708, the extended protocol 700 may determine whether to continue with the first protocol, or to enable the second protocol. Other test events (not shown) that do not belong to the extended protocol 700 may also occur while in the IDLE state 708, such as, for example, capture cycles and/or BIST execution cycles. The extended protocol 700 may determine the value at the TMS/SI pin and the value at the TDI/SE pin in step 710, step 711, and step 712. If, in step 710, the TMS/SI pin is low, or "0", and if, in step 711, the TDI/SE pin is low, or "0", then the extended protocol 700 may return to the IDLE state 708. If, in step 710, the TMS/SI pin is low, or "0", and if, in step 711, the TDI/SE pin is high, or "1", then the extended protocol 700 may proceed to the ENABLE PROTOCOL TWO state 716. If, in step 710, the TMS/SI pin is high, or "1", and if, in step 712, the TDI/SE pin is high, or "1", then the extended protocol 700 may also proceed to the ENABLE PROTOCOL TWO state 716. In this way, there may be two sets of conditions that allow the extended protocol 700 to proceed to the ENABLE PROTOCOL TWO state. If, in step 710, the TMS/SI pin is high, or "1", and if, in step 712, the TDI/SE pin is low, or "0", then the extended protocol 700 may proceed to the CONTINUE PROTOCOL ONE state 714.

From the CONTINUE PROTOCOL ONE state 714, the extended protocol 700 may determine whether to execute one or more first protocol tests, as shown in step 718. If the extended protocol 700 does not execute any first protocol tests, then the extended protocol 700 may return to the LOGIC RESET state 704. If the extended protocol 700 does execute one or more first protocol tests, then the extended protocol 700 may proceed to the PROTOCOL ONE TEST(S) state 720. The PROTOCOL ONE TEST(S) state 720 may include additional states necessary to perform one or more of the desired first protocol test(s). While in the PROTOCOL ONE TEST(S) state 720, the extended protocol 700 may test device circuitry 406 such as, for example, data registers and instruction registers. Further, while in the PROTOCOL ONE TEST(S) state 720, on-chip conditions for other testing protocols or test events may be controlled, including for example, conditions for the second protocol test, BIST execution cycles, and/or capture cycles. After completing one or more first protocol tests, the extended protocol 700 may return to the IDLE state 708.

From the ENABLE PROTOCOL TWO state 716, the extended protocol 700 may determine whether to execute one or more second protocol tests, as shown in step 722. If the extended protocol 700 does not execute any second protocol tests, then the extended protocol 700 may return to the IDLE state 708. If the extended protocol 700 does execute one or more second protocol tests, then the extended protocol 700 may proceed to the PROTOCOL TWO TEST(S) state 724. The PROTOCOL TWO TEST(S) state 724 may include additional states necessary to perform one or more of the desired second protocol test(s). While in the PROTOCOL TWO TEST(S) state 724, the extended protocol 700 may test device circuitry 406 such as, for example, logic gates. Further, while in the PROTOCOL TWO TEST(S) state 724, on-chip conditions for other testing protocols or test events may be controlled, including for example, conditions for the first protocol test, BIST execution cycles, and/or capture cycles. After completing one or more second protocol tests, the extended protocol 700 may return to the IDLE state 708.

FIG. 8 is a table that further illustrates an embodiment of the operation of the extended protocol 700 when in the IDLE state. Each of the state changes of the extended protocol 700 may occur with a clock cycle at the TCK/SCK pin. From the IDLE state, the next state of the extended protocol 700 may be dependent upon the value of both the TMS/SI pin and the TDI/SE pin. The extended protocol 700 may exit the IDLE state and may proceed to the CONTINUE PROTOCOL ONE state when the TMS/SI pin is high, or "1", and the TDI/SE pin is low, or "0". The extended protocol 700 may exit the IDLE state and may proceed to the ENABLE PROTOCOL TWO state when the TMS/SI pin is high, or "1", and the TDI/SE pin is high, or "1". The extended protocol 700 may also exit the IDLE state and may proceed to the ENABLE PROTOCOL TWO state when the TMS/SI pin is low, or "0", and the TDI/SE pin is high, or "1". In this way, there may be two sets of conditions that allow the extended protocol 700 to enable the second protocol. The extended protocol 700 may return to the IDLE state when the TMS/SI pin is low, or "0", and the TDI/SE pin is low, or "0". While in the IDLE state of the extended protocol 700, the integrated circuit device 400 may undergo other testing events that do not belong to the extended protocol 700, such as, for example, capture cycles and/or BIST execution cycles.

The extended protocol 700 may allow a device to be tested with multiple tests more quickly than with two individual protocols. The extended protocol 700 may enable the second protocol without ending the first protocol. After completing one or more second protocol tests, the extended protocol may return to the IDLE state, and then may proceed with one or more additional first protocol tests. Alternatively or in addition, the extended protocol 700 may perform one or more first protocol tests, then may enable a second protocol test from the IDLE state of the extended protocol 700. Because the extended protocol 700 may allow for multiple types of tests to be performed without exiting the protocol, the tests may be performed more quickly than if the tests each used individual protocols.

The extended protocol 700 may also allow a device with only four input/output pins available for testing to be tested with multiple protocols. By sharing the input/output pins with multiple protocol interfaces, multiple sets of pins for each type of test may not be necessary.

It should be apparent from the foregoing description that various exemplary embodiments of the invention may be implemented in hardware and/or firmware. Furthermore, various exemplary embodiments may be implemented as instructions stored on a tangible and non-transitory machine-readable storage medium, which may be read and executed by at least one processor to perform the operations described in detail herein. A tangible and non-transitory machine-readable storage medium may include any mechanism for storing information in a form readable by a machine, such as a personal or laptop computer, a server, or other computing device. Thus, a machine-readable storage medium may include read-only memory (ROM), random access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. An integrated circuit device, comprising:
a plurality of input/output pins, wherein the plurality of input/output pins further comprises both a combination Test Data Input and Second Protocol Enable (TDI/SE) pin and a combination Test Mode Select and Second Protocol Input (TMS/SI) pin;
device circuitry;
a first testing protocol interface connected to the device circuitry and to the plurality of input/output pins; and
a second testing protocol interface connected to the device circuitry and to the same plurality of input/output pins as the first testing protocol interface, wherein a first testing protocol includes an IDLE state that does not access the first testing protocol interface, and the second testing protocol interface is configured to test the device circuitry with a second testing protocol during the IDLE state of the first testing protocol when both a voltage level at the TDI/SE pin is high and a voltage level at the TMS/SI pin is high.

2. The integrated circuit device of claim 1, wherein the plurality of input/output pins further comprise:
a TCK/SCK pin configured as a test clock input pin for the first testing protocol interface and a second protocol clock pin for the second testing protocol interface; and
a TDO/SO pin configured as a test data output pin for the first testing protocol interface and a second protocol output pin for the second testing protocol interface.

3. The integrated circuit device of claim 1, wherein a return to the IDLE state occurs when the voltage level at the TMS/SI pin is low.

4. The integrated circuit device of claim 1, wherein the device circuitry is tested with the first testing protocol when the voltage level at the TDI/SE pin is low and when the voltage level at the TMS/SI pin is high.

5. The integrated circuit device of claim 1, wherein a return to the IDLE state occurs when the voltage level at the TMS/SI pin is law and the voltage level at the TDI/SE pin is low and the second testing protocol is enabled when the voltage level at the TMS/SI pin is low and the voltage level at the TDI/SE pin is high.

6. A method for testing an integrated circuit device having a plurality of input/output pins, wherein the plurality of input/output pins further comprises both a combination Test Data Input and Second Protocol Enable (TDI/SE) pin and a combination Test Mode Select and Second Protocol Input (TMS/SI) pin, comprising:
initiating, with a first testing protocol interface, a first testing protocol on the integrated circuit device, wherein the first testing protocol has an IDLE state that does not access the first testing protocol interface;
entering the IDLE state of the first testing protocol; and
enabling, with a second testing protocol interface, a second testing protocol during the IDLE state of the first testing protocol when both a voltage level at the TDI/SE pin is high and a voltage level at the TMS/SI pin is high.

7. The method of claim 6, further comprising:
returning to the IDLE state when the voltage level at the TMS/SI pin is low.

8. The method of claim 7, further comprising:
returning to the IDLE state when the voltage level at the TMS/SI pin is low and the voltage level at the TDI/SE pin is low; and
enabling the second testing protocol when the voltage level at the TMS/SI pin is low and the voltage level at the TDI/SE pin is high.

9. The method of claim 6, further comprising:
continuing the first testing protocol when the voltage level at the TDI/SE pin is low and when the voltage level at the TMS/SI pin is high after leaving the IDLE state of the first testing protocol; and
testing device circuitry of the integrated circuit device with the first testing protocol.

10. A method for testing an integrated circuit device having a plurality of input/output pins, wherein the plurality of input/output pins further comprises both a combination Test Data Input and Second Protocol Enable (TDI/SE) pin and a combination Test Mode Select and Second Protocol Input (TMS/SI) pin, comprising:
testing device circuitry in the integrated circuit device with a first testing protocol interface using a first testing protocol, wherein the first testing protocol has an IDLE state that does not access the first testing protocol interface;
enabling a second testing protocol with a second testing protocol interface during the IDLE state of the first testing protocol when both a voltage level at the TDI/SE pin is high and a voltage level at the TMS/SI pin is high; and
resuming the first testing protocol with the first testing protocol interface when the voltage level at the TDI/SE pin is low and the voltage level at the TMS/SI pin is high.

11. The method of claim 10, further comprising:
enabling the second testing protocol when the voltage level at the TMS/SI pin is low and the voltage level at the TDI/SE pin is high.

12. The method of claim 10, further comprising:
returning to the IDLE state when the voltage level at the TMS/SI pin is low.

13. The method of claim 10, further comprising:
returning to the IDLE state only when both the voltage level at the TMS/SI pin is low and the voltage level at the TDI/SE pin is low.

* * * * *